United States Patent
Matsen (10) Patent No.: US 8,106,800 B2
(45) Date of Patent: Jan. 31, 2012

(54) SELF-CALIBRATING SIGNAL RECONSTRUCTION SYSTEM

(75) Inventor: Dean C. Matsen, Shoreline, WA (US)

(73) Assignee: Honeywell International Inc., Morristown, NJ (US)

( * ) Notice: Subject to any disclaimer, the term of this patent is extended or adjusted under 35 U.S.C. 154(b) by 847 days.

(21) Appl. No.: 12/130,816

(22) Filed: May 30, 2008

(65) Prior Publication Data

US 2009/0213917 A1 Aug. 27, 2009

Related U.S. Application Data (63) Continuation-in-part of application No. 12/034,986, filed on Feb. 21, 2008, now Pat. No. 7,928,870.

(51) Int. Cl.
*H03M 1/10* (2006.01)

(52) U.S. Cl. ........ 341/120; 341/118; 341/119; 341/121; 341/143; 341/155

(58) Field of Classification Search .......... 341/118–121, 341/143, 155
See application file for complete search history.

(56) References Cited

U.S. PATENT DOCUMENTS

| | | | |
|---|---|---|---|
| 3,671,876 A | 6/1972 | Oshiro | |
| 3,984,773 A | 10/1976 | Oda | |
| 4,180,777 A | 12/1979 | Yamada et al. | |
| 4,236,253 A | 11/1980 | Onishi et al. | |
| 4,763,207 A | 8/1988 | Podolak et al. | |
| 4,970,582 A | 11/1990 | Scott | |
| 5,818,370 A * | 10/1998 | Sooch et al. | 341/120 |
| 5,848,040 A | 12/1998 | Tanaka | |
| 5,887,244 A | 3/1999 | Aldridge et al. | |
| 5,936,561 A * | 8/1999 | Lee | 341/143 |
| 6,084,837 A | 7/2000 | Miyanabe et al. | |
| 6,271,781 B1 * | 8/2001 | Pellon | 341/143 |
| 6,407,685 B1 * | 6/2002 | Handel et al. | 341/120 |
| 6,631,341 B2 | 10/2003 | Kameda et al. | |
| 6,690,311 B2 * | 2/2004 | Lundin et al. | 341/120 |
| 6,725,248 B1 | 4/2004 | Hasegawa et al. | |
| 6,744,390 B1 * | 6/2004 | Stice | 341/120 |
| 6,781,938 B2 | 8/2004 | Nanba et al. | |
| 7,095,803 B2 | 8/2006 | Gazsi et al. | |
| 7,250,886 B1 * | 7/2007 | Killat et al. | 341/143 |
| 7,382,297 B1 * | 6/2008 | Kopikare et al. | 341/118 |
| 7,424,066 B2 | 9/2008 | Montalvo et al. | |
| 7,944,378 B1 * | 5/2011 | Pesenti | 341/118 |
| 2005/0093722 A1 * | 5/2005 | Smith et al. | 341/118 |
| 2006/0132339 A1 * | 6/2006 | Alon et al. | 341/120 |
| 2008/0084339 A1 * | 4/2008 | Anderson | 341/122 |
| 2009/0131010 A1 * | 5/2009 | Oshima et al. | 455/334 |

OTHER PUBLICATIONS

Steven W. Smith, "The Scientist and Engineer's Guide to Digital Signal Processing," pp. 319-332, 2007.

* cited by examiner

*Primary Examiner* — Linh Nguyen
(74) *Attorney, Agent, or Firm* — Seager, Tufte & Wickhem LLC (57) ABSTRACT

An approach for calibrating a signal reconstruction system. A signal may be input to a low-pass filter. An output of the filter may be converted to a digital signal which goes to a processor which outputs a reconstruction of the signal to the filter. The reconstruction may be based on an expression that maintains the accuracy of the reconstruction. The expression may include information about samples of the input signal and a low value of the reconstruction. The expression may permit initial calibration and then maintenance of the calibration. The calibration may include compensating for inexpensive components of the filter which have values significantly different than indicated values and/or have large drifts over temperature changes.

20 Claims, 14 Drawing Sheets

SELF-CALIBRATING SIGNAL RECONSTRUCTION SYSTEM

This application is a continuation-in-part of U.S. patent application Ser. No. 12/034,986, filed Feb. 21, 2008. U.S. patent application Ser. No. 12/034,986, filed Feb. 21, 2008, is hereby incorporated by reference.

BACKGROUND

The invention pertains to signal processing, and particularly to reconstructive signal processing.

SUMMARY

The invention is a self-calibrating system for reconstructing high-frequency signals put through a low-pass filter.

DESCRIPTION

The present invention is a self-tuning system for reading high-frequency pulses through a low-pass filter. It may include an approach for using an analog input from which a pulse count may be obtained indirectly. The input signal to a low-pass filter of the approach cannot realistically be used for the count in absence of additional hardware to pick up the signal. Additional hardware means undesired expense. In the approach, pulse counting of the input may be achieved without adding any hardware specific to counting, like a second path for the input signal, which could be a high frequency path around the filter. In the approach, the input signal may be reconstructed after the filter. This approach appears to work even if there is a resistor-capacitor (RC) filter in the analog input hardware that severely attenuates frequencies in the range of which pulses are to be counted. The approach may essentially include reading high frequency pulses coming through a strong low-pass filter.

Pulse counting hardware may be different from analog input hardware partially because the bandwidth needed for pulse counting appears to be in conflict with the low-pass filtering requirements of an analog input.

At a highest level, the approach may operate by nearly exactly reconstructing the original signal being input to the RC filter. This approach may appear workable in a manner contrary to normal intuition. Further, it may be done more simply than intuition would suggest. The approach may be done without accumulating any state information except for a previous sample value. This may eliminate the possibility of long term round off, drift, or instability. It also means that the approach may work accurately at arbitrarily low frequencies.

Other approaches may include specific inputs that count pulses, but are not capable of doing any analog-to-digital conversion, and do not share terminals with analog input hardware. This generally adds costs to the product because more hardware appears to be required.

Still other approaches may include sharing the same input terminals between an analog input and pulse-counting input, but ultimately have the signal go through two different paths. This appears to be basically the same as having dedicated pulse-counting hardware, except that the terminals are shared with analog input hardware. Once again, these approaches may involve added costs for the pulse counting capability.

The pulse counting approach may include an input block for providing biasing and filtering. The counting approach may be shown with an example which involves re-engineering a pulse counting algorithm using a low-pass RC filter on the input.

It may be noted that by doing a computation on the differences between consecutive A/D readings, pulses through an RC filter could be counted. But there may be some difficulties with using a fixed threshold; however, it appears that some sort of relatively simple incremental state-maintaining algorithm might accomplish the task of counting pulses. Whatever algorithm is to be used, it should be simple, run at about 640 Hz, and do computations for up to three channels for certain product needs, but there may be more or less channels.

One may consider the following example, in which a 100 Hz square wave is presented at the input immediately following the tail end of a very long square wave. If one were to set a fixed threshold at 512 Hz, the system would miss the first two pulses following the long pulse. However, this could possibly be alleviated by having a moving threshold. For instance, the threshold may simply be the output of a low-pass IIR (infinite impulse response) filter with a lower frequency than the RC filter itself (but not so low that the threshold would fail to keep up with the special case shown herein). However, if the threshold reacts fast enough for such case, one's intuition may indicate that it would not function properly over the other extreme case of a ten minute long square wave (i.e., it would tend to follow such a long square wave too closely).

Ultimately, one thing that may indicate having the wrong solution is a situation where the input is a ten minute line sine wave. Then the slowly-moving-threshold approach would appear to simply follow the sine wave and not provide a useful threshold point at all. One might argue that responding to a sine wave is not needed, but one may have to admit that certain designs do respond to a sine wave.

A goal is to cancel out the effects of the RC filter. If one designed a system that accomplished a cancellation of such effects, it might be unstable (which is often a concern with IIR filters) or require too much computation if done at 640 Hz. However, it may be noted that not only can such design be safely done with integer-only math; it may be implemented without any feedback (meaning that it would not get out of sync or become unstable). The only state variable in this designed system would be a previous A/D reading.

The design of the system may begin with a characterization the low-pass RC filter as an IIR filter in order to get its constants. A form of a single-pole IIR filter may be:

$$y_n = a_0 x_n + b_1 y_{n-1}. \quad (1)$$

The constants for this equation may be computed as:

$$b_1 = e^{-2\pi f_c / f_s}$$

and $$a_0 = 1 - b_1$$

where $f_c$ is a −3 dB point of the RC filter and $f_s$ a sample rate of the analog-to-digital converter. The RC filter of the input block 12 may have a −3 dB point of $1/(2*\pi*R*C) = 1/(2*\pi*34000*0.00000047) \approx 10$ Hz. Thus, for a sample rate of 640 Hz, $$b_1 = e^{-2\pi(10/640)} = 0.9064905$$

and $$a_0 = 0.0935095.$$

By solving the equation (1) for $x_n$, one may get $$x_n = (1/a_0) y_n - (b_1/a_0) y_{n-1} = 10.694 y_n - 9.694 y_{n-1}.$$

It may be noted that the computation of $x_n$ seems to just depend on two consecutive A/D readings. Since there appears to be no possibility of accumulated errors, the following equation is nearly as good.

$$x_n = 11 y_n - 10 y_{n-1} \quad (2)$$

A critical thing here is that the two constants are different from each other by virtually exactly one (in this instance, 11−10=1). Since the $x_n$ is a reconstruction of the original waveform, ranging from 0 to 1023 (in a 10-bit A/D case); an absolute threshold (e.g., around 512) for the 10-bit A/D may be used. It may be noted that the $x_n$ resulting from equation (2) is specific to the parameters of the filter and the sample rate. The 640 Hz sampling rate, which can be optional, may be regarded as integral to the 50/60 Hz of common power lines, and thus helpful in rejecting 50/60 Hz noise at the input side of the A/D converter.

The low-pass filter may be a multiple-pole filter and a corresponding characterization may be provided and implemented in a similar manner as the characterization provided herein for the single-pole low-pass filter.

Figure 1:
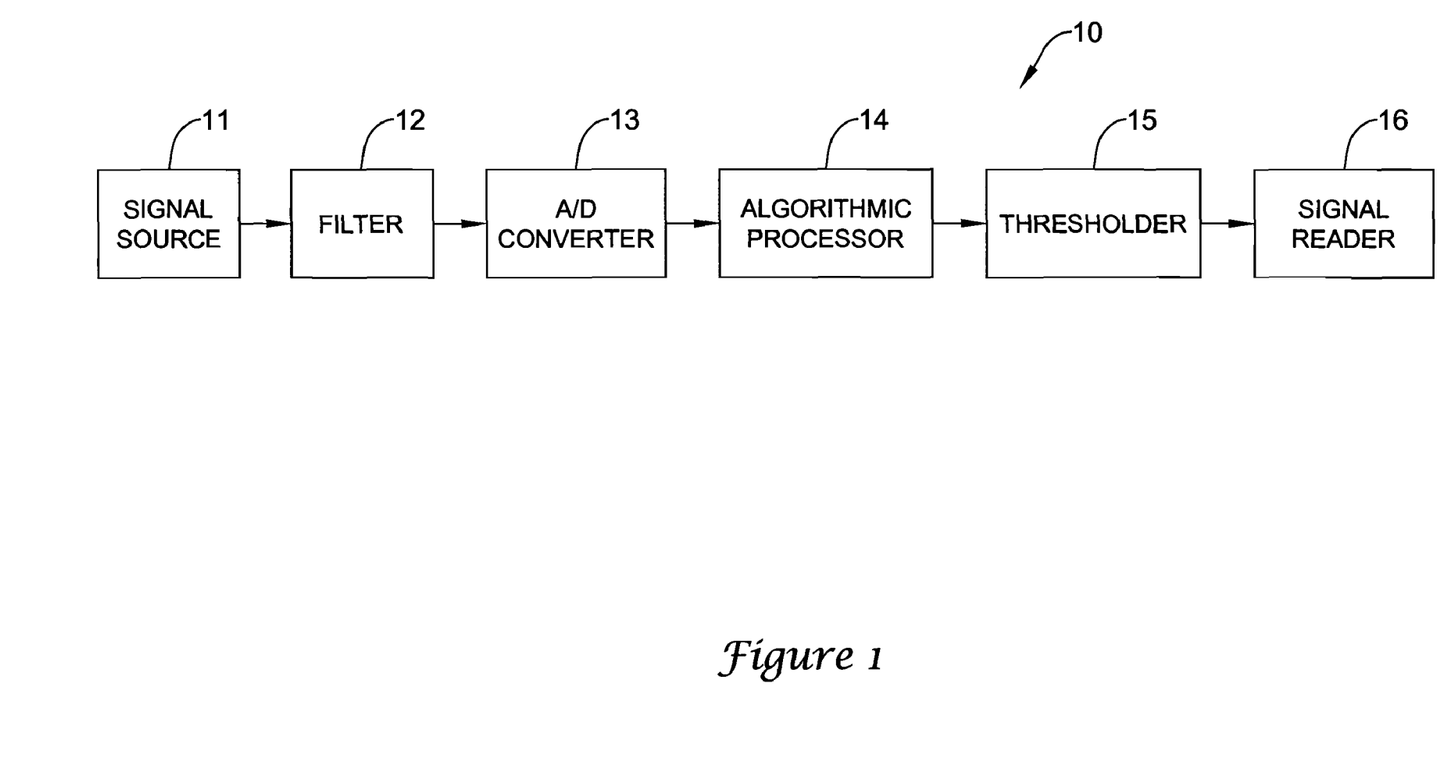
FIG. 1 is a block diagram of a signal reader system.

FIG. 1 is a block diagram of the system 10 applicable to pulse counting. A signal or pulse source 11 may provide an output to an RC filter 12. An output of filter may go to an input of an analog-to-digital (A/D) converter (ADC) 13. ADC 13 may provide an output to an algorithmic processor 14. The signal may be processed according to the algorithm described herein (i.e., equation (1)). Also, the algorithm may be adapted for compensating temperature drifts of filter 12. Processor 14 may be used for reconstructing an input signal to filter 12.

ADC 13 and processor 14 may be regarded together as a signal reconstructor. The output of processor 14 may go to a signal thresholder 15. The thresholder 15 may condition signals from the processor 14 into digitally-formed or pulse-like shaped signals. From thresholder 15, the output signals may be provided to a signal reader 16 having a counter for counting pulses. For certain kinds of signals, processor 14 might be directly connected to the signal reader 16.

Figure 2:
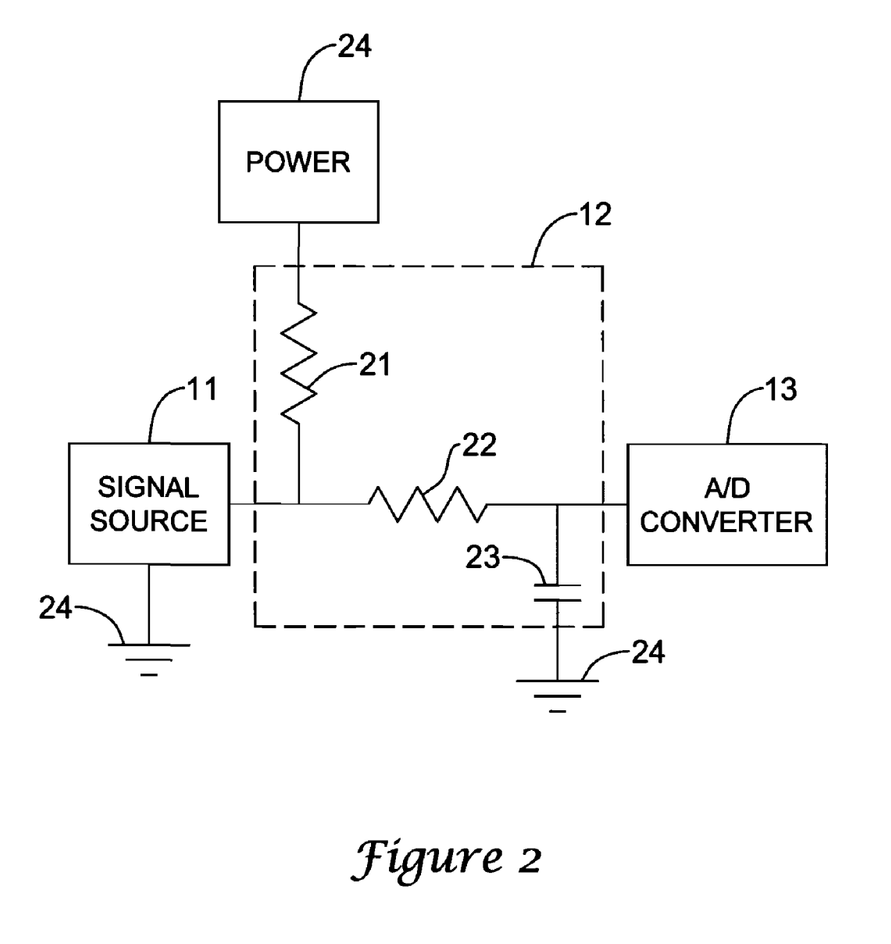
FIG. 2 is a schematic diagram of a low-pass filter in the system.

FIG. 2 shows the low-pass RC filter 12 having an output connected to the input of ADC 13. An input signal may be provided by a signal or pulse source 11 to filter 12 at a common connection of resistors 21 and 22. Resistor 21 may have a value of about 10K ohms and resistor 22 may have a value of about 100K ohms. The other ends of resistors 21 and 22 may be connected to a power source 24 and a capacitor 23, respectfully. Capacitor 23 may have a value of about 0.47 microfarads. The indicated values of the resistors and capacitor are examples but could be other values. The output of filter 12 may be at the common connection of resistor 22 and capacitor 23 which may go to the input of the ADC 13. A reference voltage of the various components of system 10 may be a ground 24.

Figure 3:
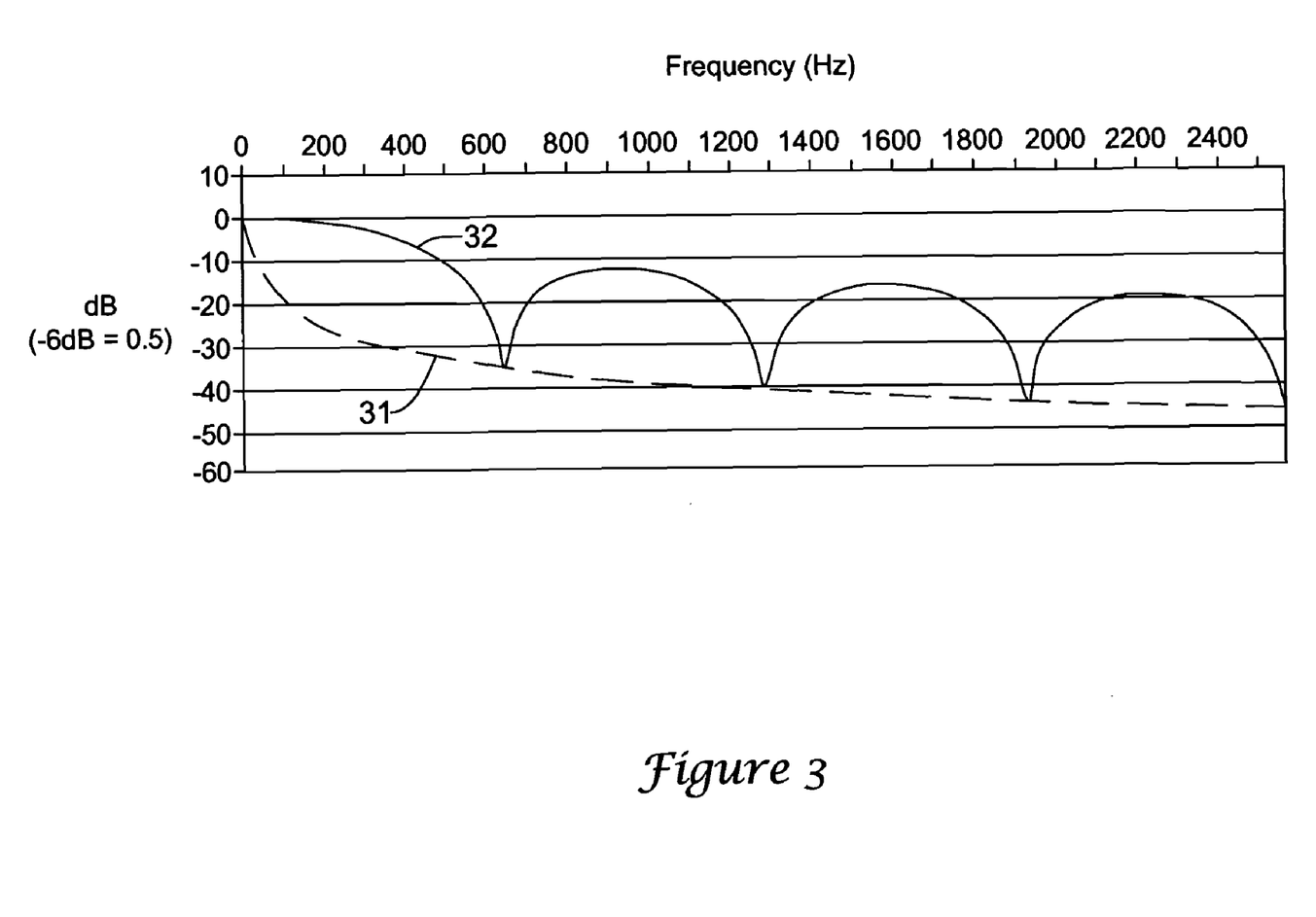
FIG. 3 is a graph of a response of the low-pass filter plus a reconstruction filter.
Figure 4:
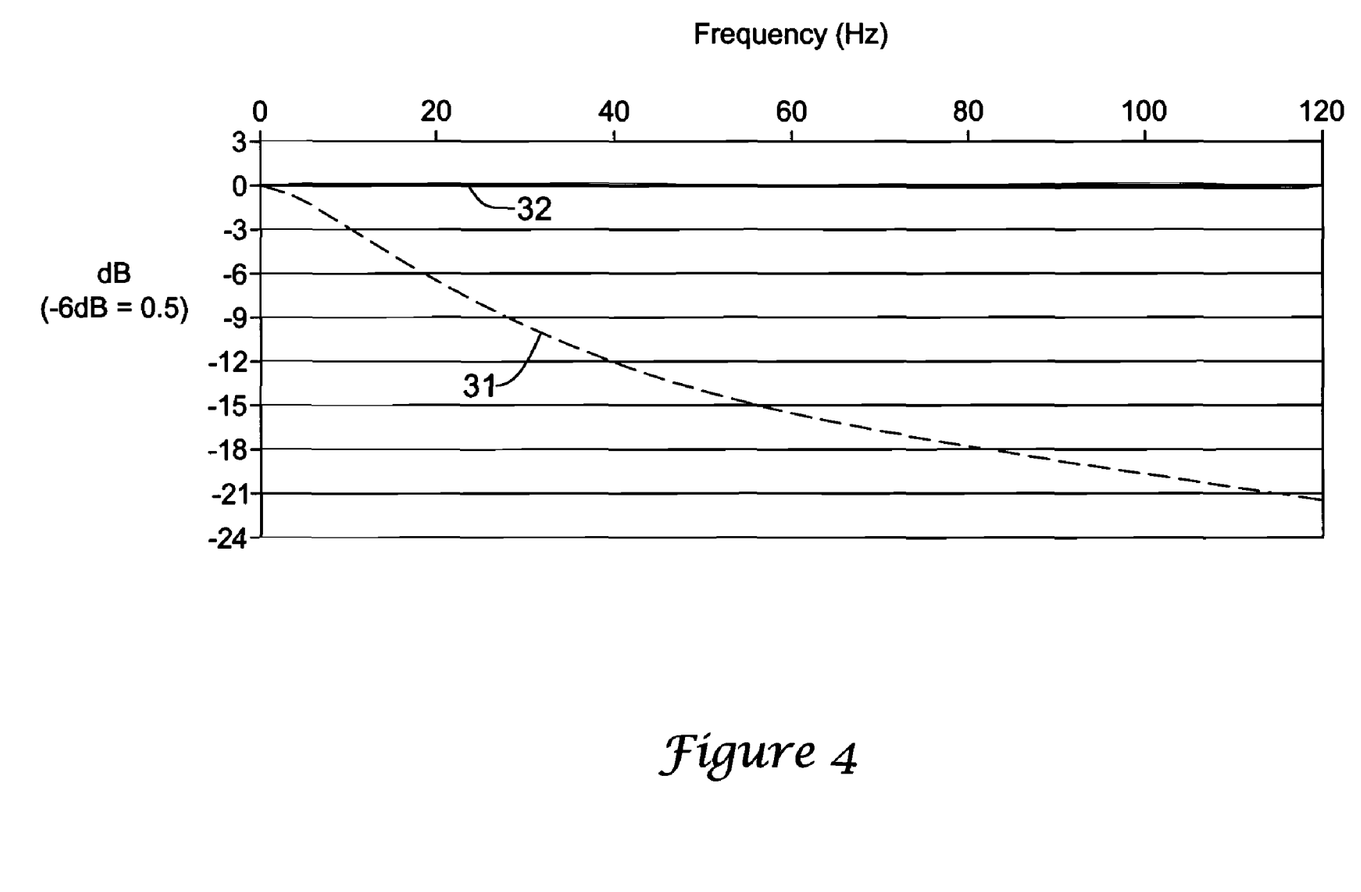
FIG. 4 is a graph showing a closer view of a portion of the graph in FIG. 3.

The frequency response of the RC filter 12 plus the response of reconstruction filter (using 10 and 11 as constants—equation (2)) in the processor 14 is shown as curve 32 in the graph of FIG. 3. In the range from 0 to 100 Hz, the overall reconstructed response 32 may appear very nearly ideal, as shown in FIG. 4. FIG. 4 may effectively be a zoomed-in version of the graph in FIG. 3, from zero to 120 Hz. Plot 31 may be a response of just the RC filter 12. The graphs of FIGS. 3 and 4 show plots in terms of dB (−6 dB=0.5) versus frequency.

Relative to the 640 Hz sampling scenario, one concern may be that there is a high response around 920 Hz, with the overall attenuation being only about 13 dB. 920 Hz may be aliased to 280 Hz. The next such high response point may be near 1575 Hz, at about 17 dB attenuation. 1575 Hz may alias to 295 Hz. Both of these aliased frequencies appear outside the 0 to 100 Hz range. Such high-frequency noise could occur due to contact bouncing, making this a legitimate concern.

The situation might be improved with a 100 Hz low pass filter after the reconstruction filter, but a single-pole low pass filter seems not strong enough (in that 100 Hz appears too close to the middle of the 640 Hz spectrum). A higher order filter could be probably too CPU intensive to implement at such a high rate.

A solution may be to set hysteresis or threshold points at ¾-full-scale and ¼-full-scale, so that a full-amplitude signal with 13 dB of attenuation (i.e., about one quarter amplitude) gets rejected.

Figure 5:
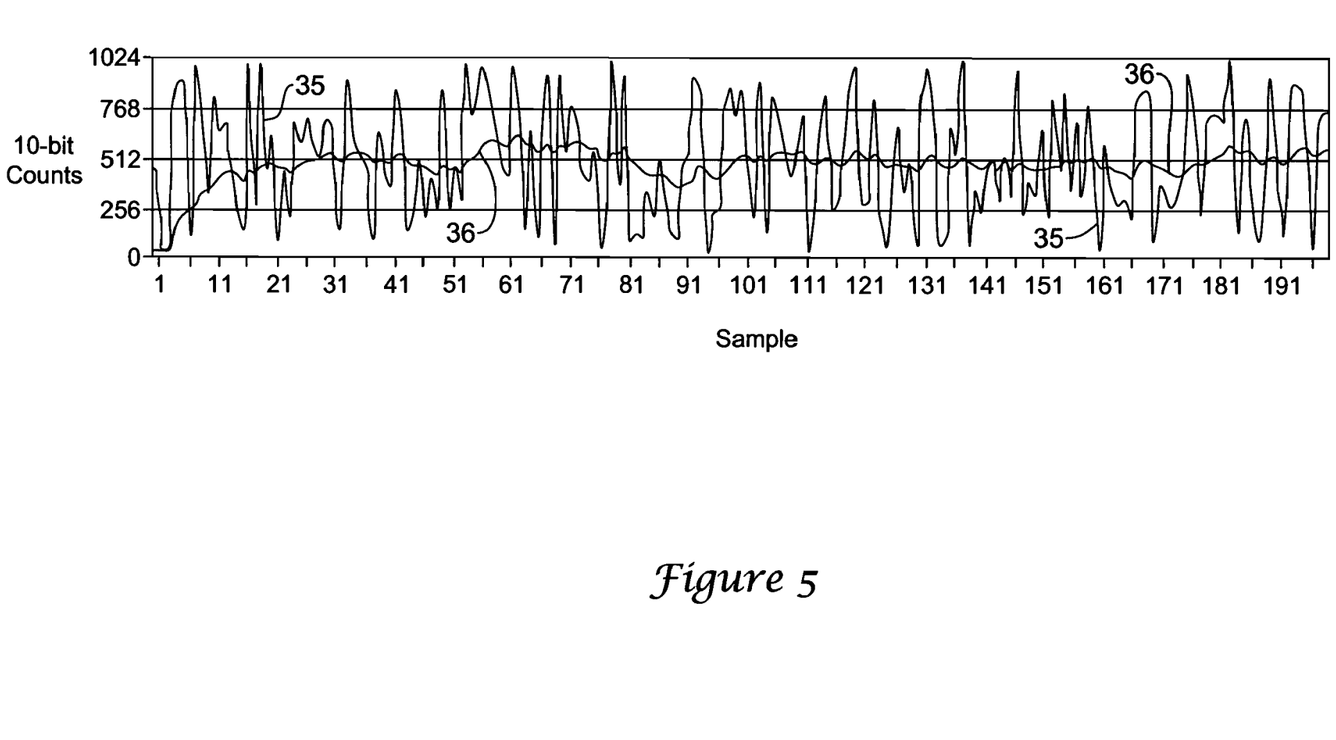
FIG. 5 is a graph of an input and output signals of the low-pass filter.
Figure 6:
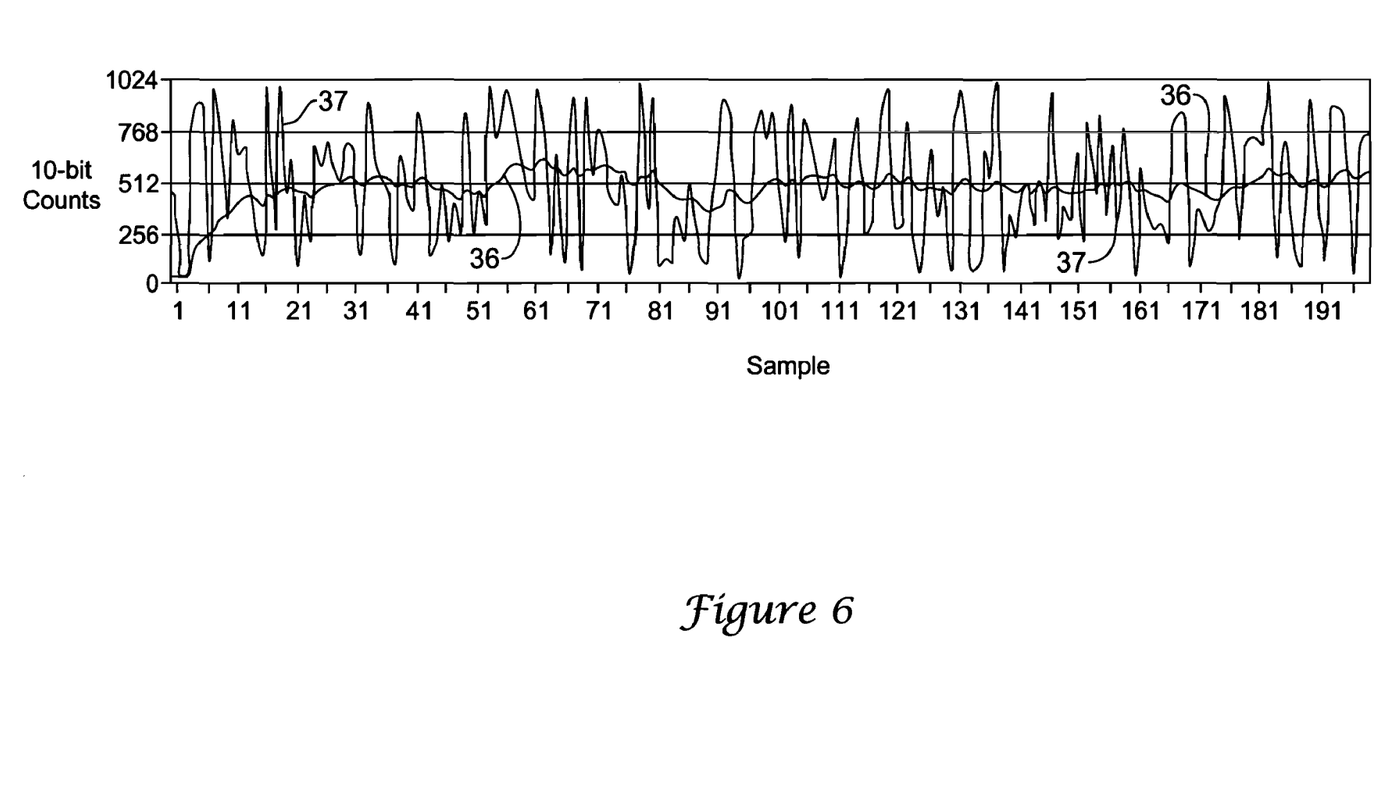
FIG. 6 is a graph of the low-pass filter output signal and a reconstructed input signal of the filter.

Test or simulation results may be noted. An input test using random noise may be done to see if the reconstruction IIR filter is unstable in the face of noise. Such test was done before it was realized that the filter appeared not to be an IIR filter, but rather an FIR (finite impulse response) filter of a length 2, and thus would not become unstable. A distinguishing aspect of the FIR filter may be a lack of $x_{n-1}$ in equation (1). FIG. 5 is a graph of the test on a basis of 10-bit counts versus sample number. Line 35 is a plot of the raw input to an RC filter 12 and line 36 represents an output of the RC filter (an A/D 13 input). FIG. 6 is a graph which shows a reconstructed filter input in terms of 10-bit counts versus sample number. A line 37, representing a reconstruction of the original input, may be generated directly from an RC filter 12 output (an A/D or ADC 13 input) signal represented by line 36 in the graph.

Figure 7:
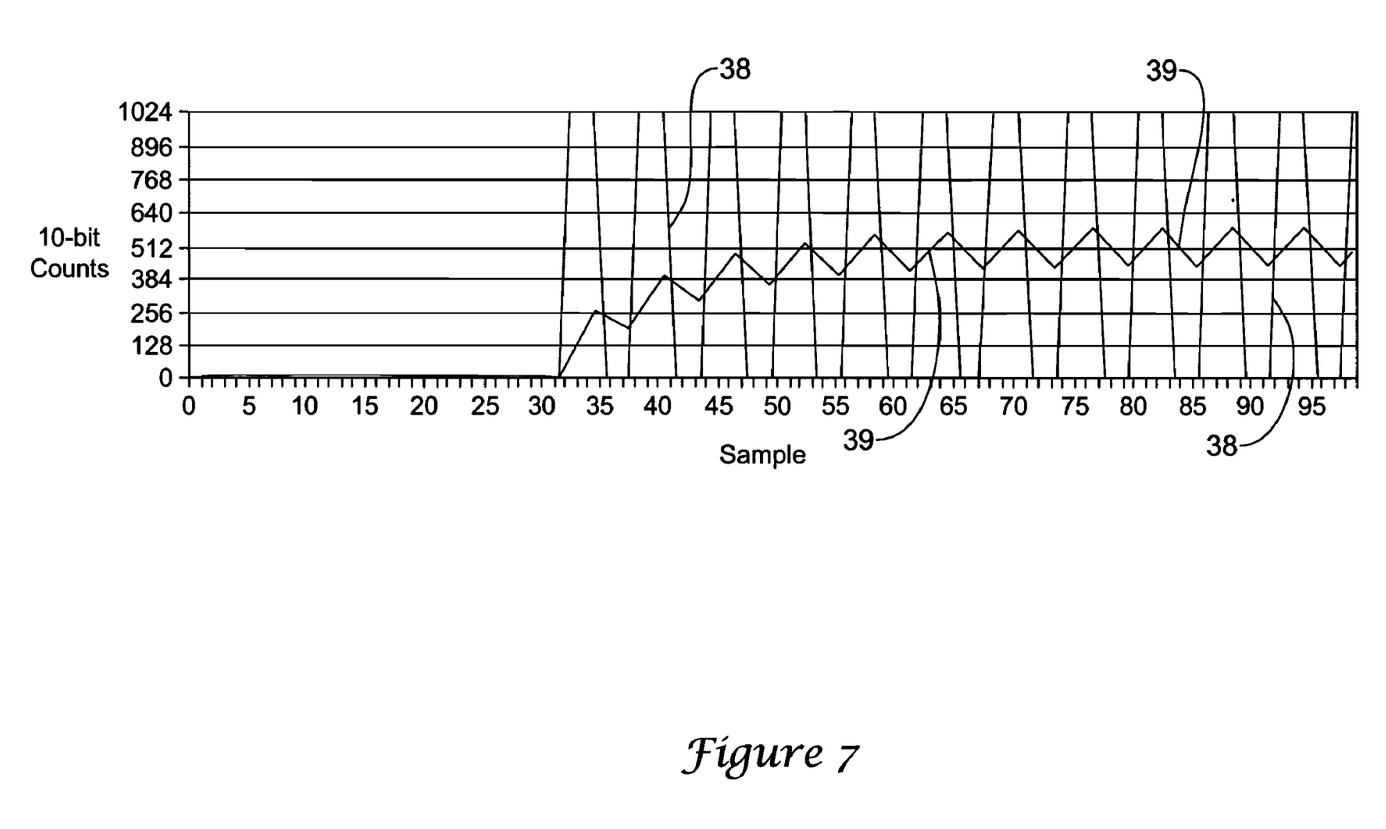
FIG. 7 is a graph of input and output signals of the low-pass filter for a very low frequency wave followed by a higher frequency.
Figure 8:
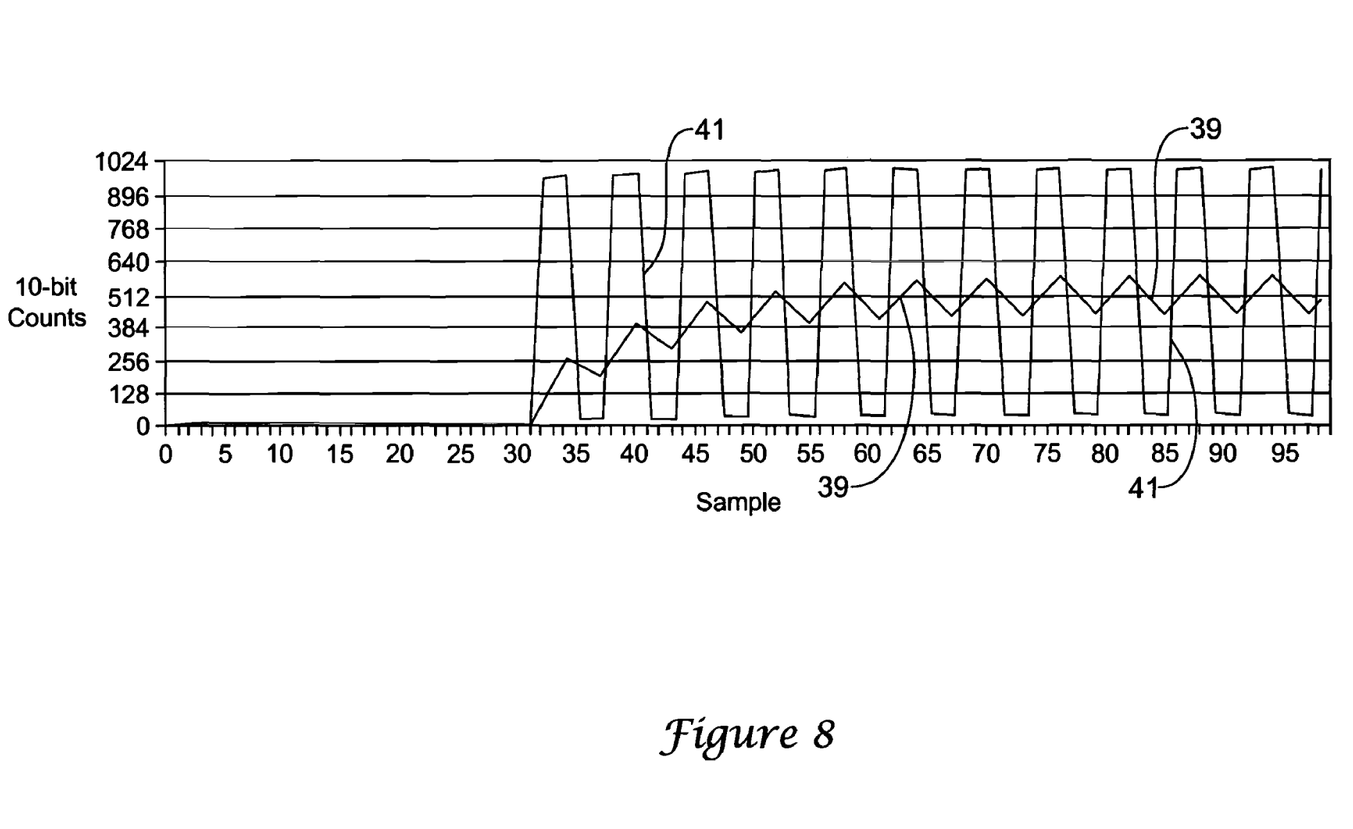
FIG. 8 is a graph the low-pass filter output signal and a reconstructed input signal to the filter for the very low frequency wave followed by a higher frequency.

FIG. 7 is a graph where a very low frequency wave is followed by 100 Hz. Line 38 represents a raw input and line 39 represents an RC filter 12 output (an A/D input). FIG. 8 is a graph that shows a reconstruction of the raw input in FIG. 7. Line 41 in FIG. 8 represents the reconstruction of the original waveform and line 39 represents the RC filter output (A/D input). One may note that the reconstructed signal 41 appears attenuated a little bit, which is probably due to a rounding off of the filter constants.

Figure 9:
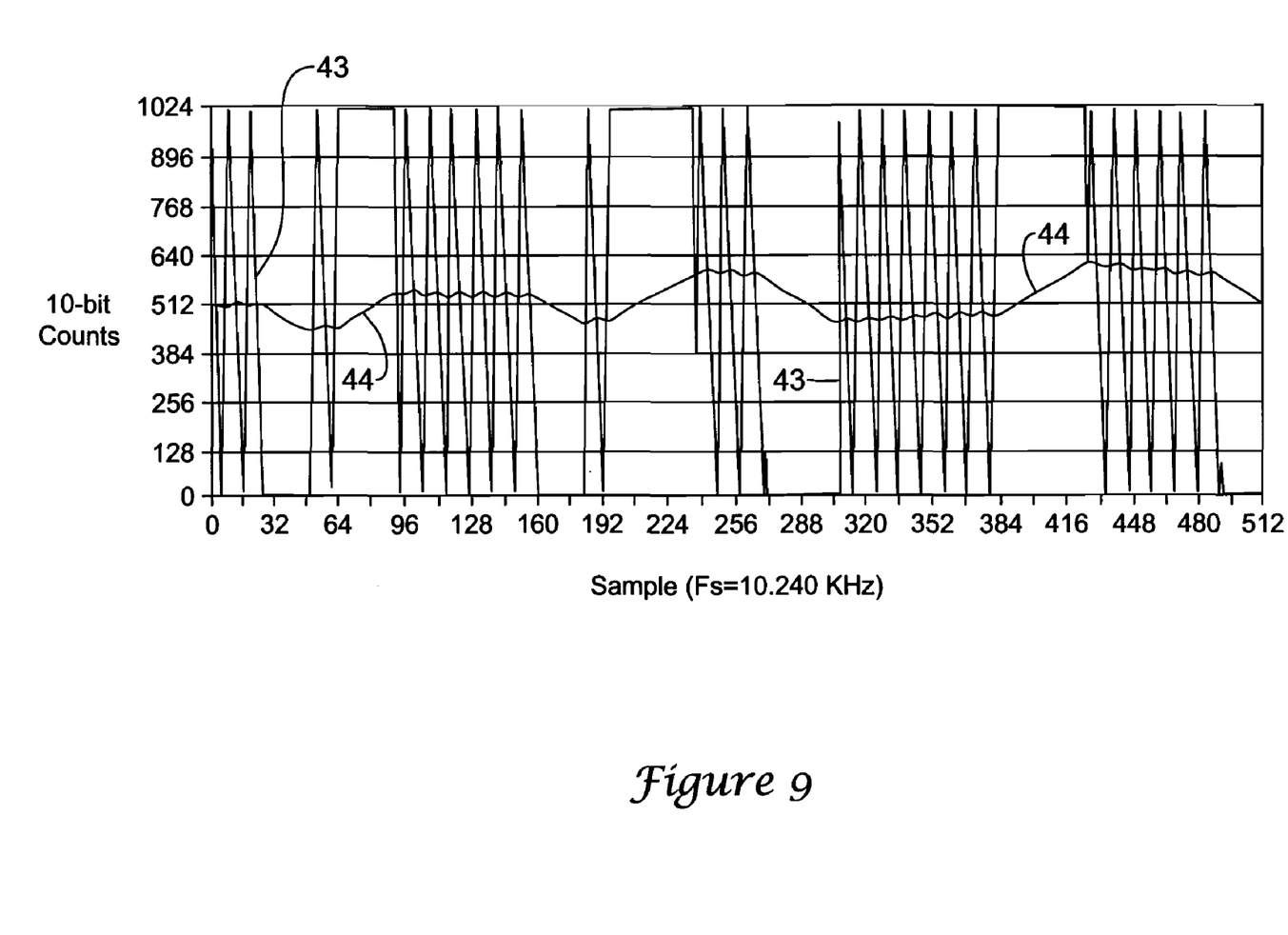
FIG. 9 is a graph showing a reconstruction of a worst-case scenario of a low-pass filter input having sinusoidal noise at a certain frequency in transitions between high and low, and showing the filter output.
Figure 10:
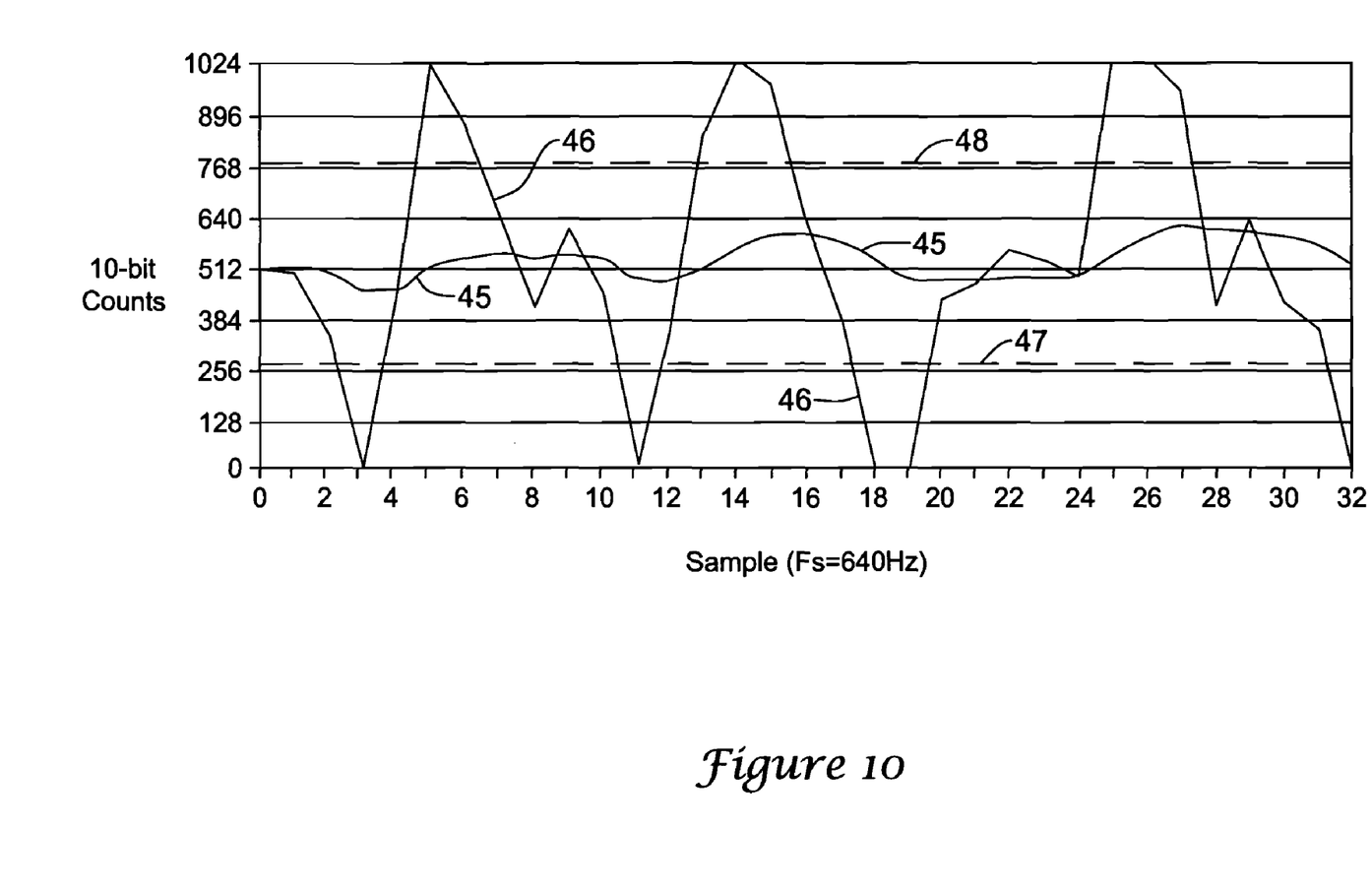
FIG. 10 is a graph showing the low-pass filter output in the graph of FIG. 9 decimated by a certain factor, and showing a reconstruction of the filter input along with low and high thresholds.

Noise rejection may be noted. The graph of FIG. 9 shows an attempt to reconstruct the worst-case scenario of having virtually an exact 930 Hz of sinusoidal noise in the transitions from high to low. This simulation may be done at 10.240 KHz so that the effects of the RC filter 12 can be replicated appropriately. The graph of FIG. 9 shows 10-bit counts versus sample number with sample frequency at 10.240 KHz. The noise may be simulated at 10.240 KHz. The raw data input is represented by line 43 and the RC filter 12 output is represented by line 44 in the graph of FIG. 9. The RC output in the graph of FIG. 9 may be decimated by a factor of 16, leading to line 45 representing the RC output (A/D input) in the graph of FIG. 10. The graph of FIG. 10 shows 10-bit counts versus sample number with a sample frequency of 640 Hz. The decimation factor x16 may simulate the 640 Hz sampling with its aliasing implications. In this case, the 930 Hz sine wave may be aliased down to 290 Hz. One may note how the line 45 (RC output) in the graph of FIG. 10 hardly shows the input noise, yet the reconstruction filter (i.e., algorithmic processing of processor 14) produces a reconstruction, as indicated by line 46, of the original wave having a 290 Hz signal near samples 8 to 10, and also near samples 28 to 31. This appears to be because of the "hump" in the frequency response near 930 Hz. As expected, however, this signal may be attenuated enough so that it does not go outside the ¼ and ¾ thresholds, as shown by lines 47 and 48, respectively. Thus, this signal or noise may be rejected by a threshold/hysteresis algorithm of thresholder 15.

Figure 11:
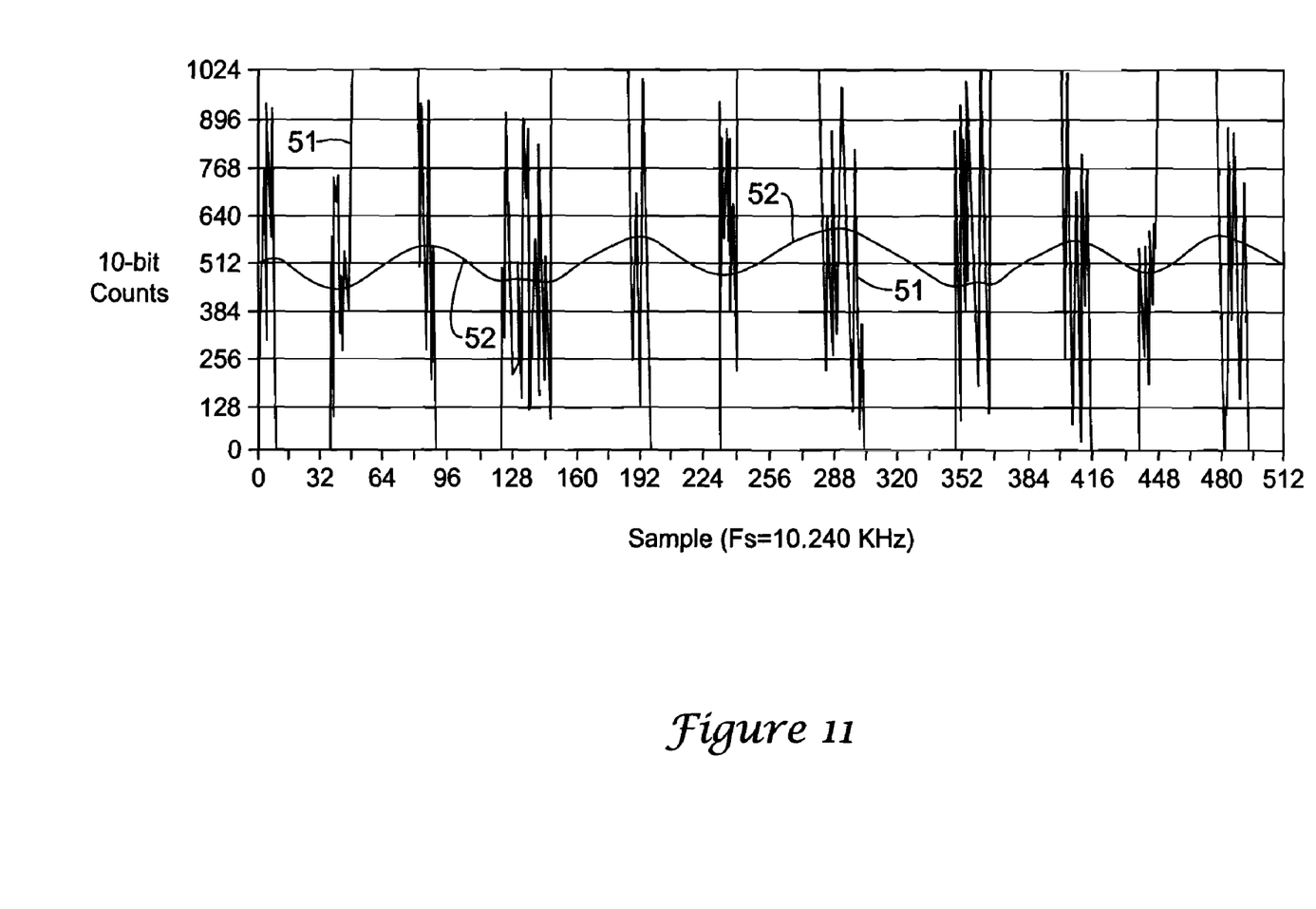
FIG. 11 is a graph showing a reconstruction of a worst-case scenario of a low-pass filter input having white noise in transitions between high and low, and showing the filter output.
Figure 12:
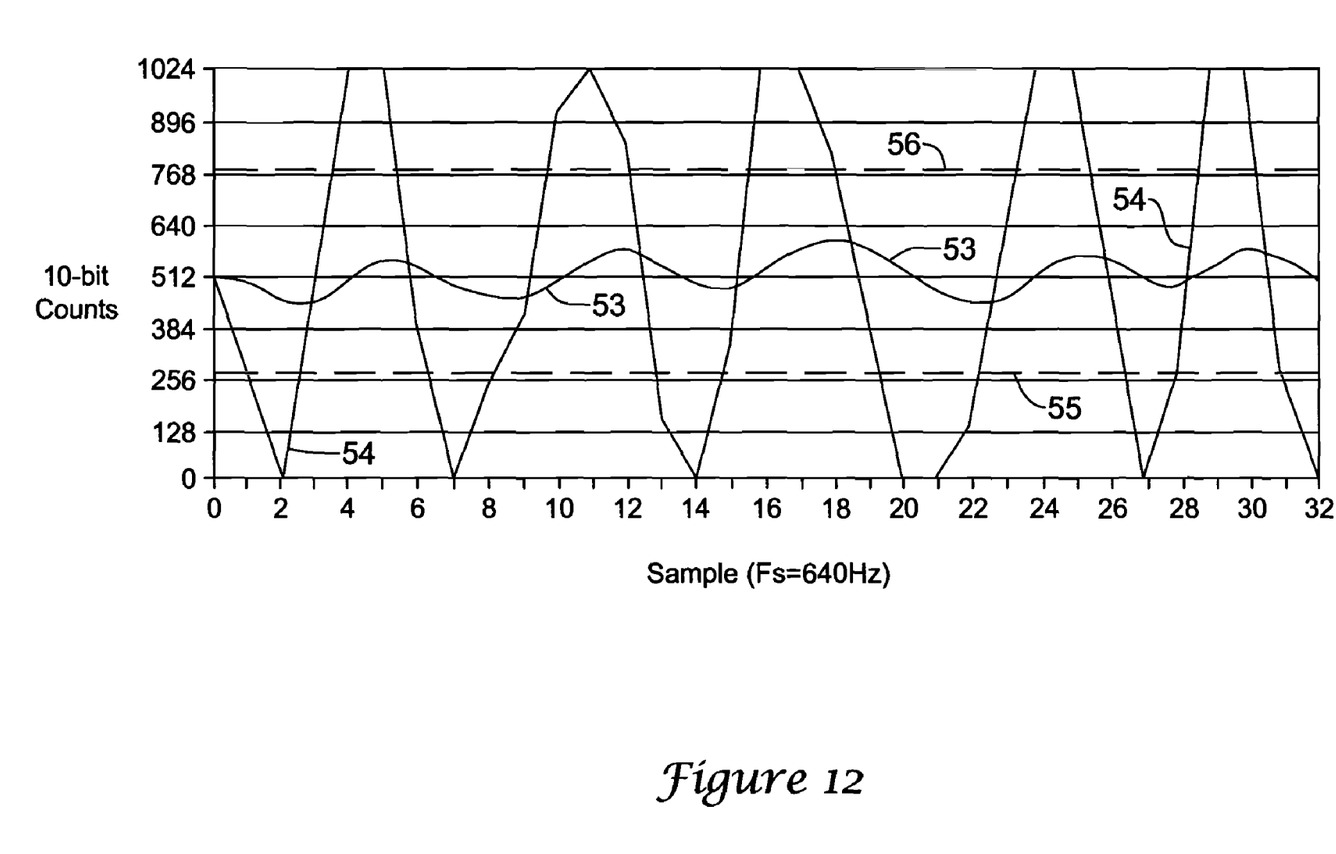
FIG. 12 is a graph showing the low-pass filter output in the graph of FIG. 11 decimated by a certain factor, and showing a reconstruction of the filter input along with low and high thresholds.

Another realistic simulation may be provided in a graph of FIG. 11. The graph of FIG. 11 shows 10-bit counts versus sample number with a sampling frequency at 10.240 KHz. The noise may be simulated at 10.240 KHz. Line 51 represents the raw input and line 52 represents the output of RC filter 12. White noise may appear in the transitions. This graph appears to show performance better than the 930 Hz case because the white noise has a more spread out spectrum. The input may be reconstructed in a graph of FIG. 12. The graph of FIG. 12 shows 10-bit counts versus sample number with a sampling frequency at 640 Hz. Line 53 represents the RC filter 12 output (ADC 13 input) and line 54 represents a reconstruction of the original waveform of the filter 12 input. Lines 55 and 56 represent upper and lower thresholds, respectively. There may, under certain circumstances and design, instead be just one threshold.

With regards to the signal reading system 10 noted in FIG. 1, another approach indicated herein is a way to use the system for even higher frequency signals, under certain conditions. The approach may account for circuit component tolerances and temperature drift. The apparatus of FIGS. 1 and 2 may be applicable; but with some hardware and software algorithmic changes, it may result in a system 20. The approach of present system 20 may be applicable to the signal reconstruction algorithm noted herein.

System 20 may be used relative to digital serial communications, particularly to Alerton™ Microset™ communications. With such communications, some features of a waveform input to the present system may have higher frequencies than the underlying sample rate, thus resulting in a need for filter components having values with little variation from the indicated values, and having insignificant changes due to environmental conditions.

With system 20, a high frequency waveform may be reconstructed from a low-pass RC filter output sufficient enough for Microset™ communications. Because cost is a factor, a desired high performance approach using inexpensive components may require compensation since such components may have values with large variation from the indicated values, and/or significant changes due to environmental conditions such as temperature drift.

The signal reconstruction may be based on the following formula.

$$x_n = (1/a_0)y_n - (b_1/a_0)y_{n-1},$$

where
$b_1 = e^{(-2\pi f_c/f_s)} = e^{(-1/RCf_s)}$,
$f_c = -3$ dB point of RC filter $= 1/(2\pi RC)$,
$f_s =$ sample frequency, and
$a_0 = 1 - b_1$.

The constants $a_0$ and $b_1$ may be dependent on the values of R and C, i.e., the resistance and capacitance of the RC filter components. As to an inexpensive capacitor, the tolerance of the capacitor's nominal value might not be very stringent in that it may vary plus or minus 20 percent of its indicated value. The nominal value may also drift an extra 5 percent or so, one way or the other, with temperature change. System 20 may indicate how correct values of constants $b_1$ and $a_0$ (based on exact values of R and C) may be directly determined by monitoring a known signal.

Figure 13:
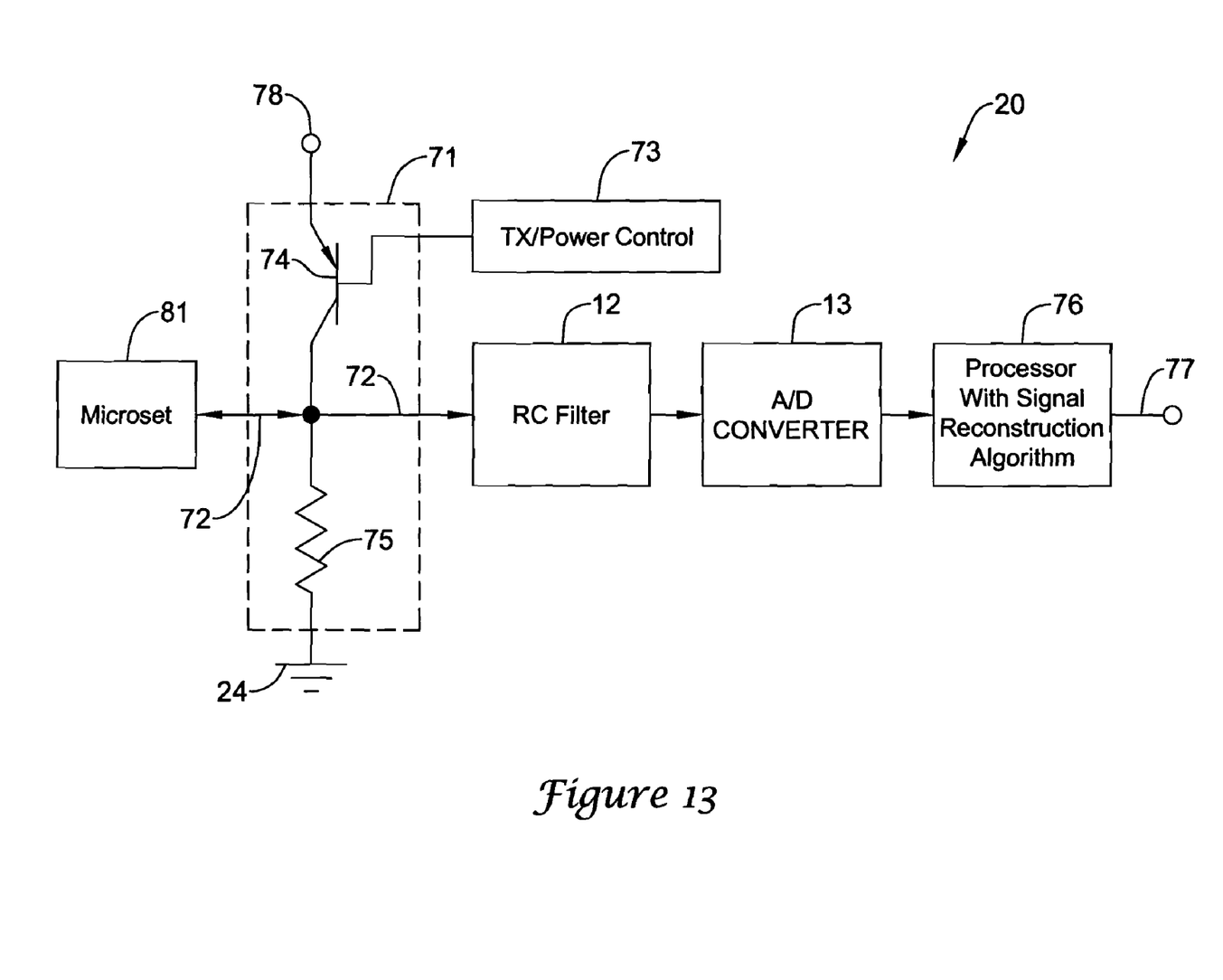
FIG. 13 is a diagram of an apparatus of the present system.
Figure 14:
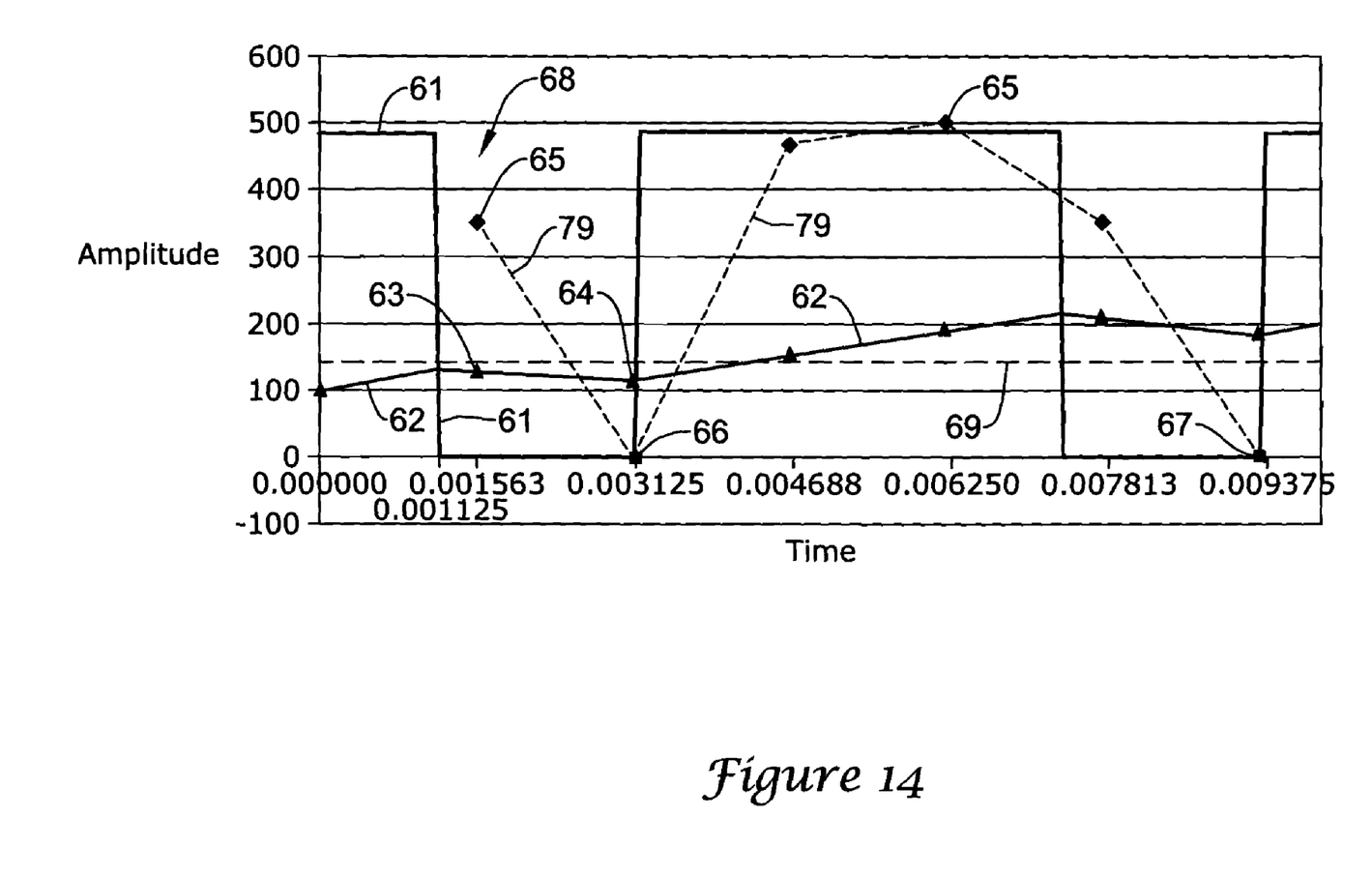
FIG. 14 is a diagram of the waveforms illustrating the present system.

FIG. 13 is a diagram of system 20 using the present approach. A microset 81 may have a two-way connection on line 72 to a circuit 71. For a period of time sufficient for calibration, a "1" signal may be output to circuit 71 from a TX/power control 73. Communications may in general proceed with TX/power control 73 along with a signal or signals for calibration.

Control 73 may output a signal to a base of a PNP transistor 74 to cause the raw line data 61 (FIG. 14) to go to zero for about 2 milliseconds. Transistor 74 may have an emitter connected to a terminal 78, having a positive voltage such as 5 volts, and have a collector connected to line 72 and to one end of a resistor 75. The other end of resistor 75 may be connected to a ground 24. Resistor 75 may be about 4.7K ohms or another effective value. Line 72 may be connected to an input of RC filter 12. The output of filter 12 may go to an input of A/D converter 13. The output of the A/D converter 13 may go to a processor 76 with a signal reconstruction algorithm. Processor 76 may be regarded to as an algorithmic processor. An output 77 from processor 76 may provide a reconstruction signal 79.

Signal 79 may or may not go to the thresholder 15 of FIG. 1. Thresholder 15 may have one threshold level 69 (FIG. 14) with no hysteresis, rather than more than one threshold level as otherwise may be indicated herein. If the thresholder is used, then an output of thresholder 15 may go the signal reader 16 of FIG. 1.

The calibration algorithm may be noted in the following. Calibration may involve a known waveform 62 made from a "raw line data" or waveform 61, as shown in a diagram of amplitude versus time of FIG. 14. Waveform 62 may be an output from the low-pass RC filter 12 having waveform 61 as an input to filter 12. There may be two A/D samples 63 and 64 of waveform 62. Diamonds 65 and squares 66 and 67 are the points of the reconstruction signal 79 from output 77 of processor 76. A square 66 is a low point of the reconstructed signal 79 and should be zero when the value of $b_1$ is appropriate. The host may contrive to put the second sample 64 at the end of the low-going pulse 68. Squares 66 and 67 may be regarded as a reconstruction output $x_n$ which should be at zero. The diagram also shows a threshold level 69.

In the case of the microset communications, there may be a scenario where a host sends a "1" to the microset 81. After sending a "1", the host may drop the TX/power for 2 milliseconds, thus causing the raw line data 61 to go from a logic "one" to zero volts for about 2 milliseconds, which should be long enough to include two 640 Hz samples, the samples being about 0.001563 second apart. At 0.001563 second and 0.003125 second, the two samples 63 and 64 would occur when the raw line data 61 is at zero volts. Samples 63 and 64 may be designated as $y_{n-1}$ and $y_n$, respectively. Since it is evident that the raw line data 61 makes no immediate excursion away from 0 volts between samples 63 and 64 (i.e., which effectively indicates a perfect 0 volt DC with no higher frequency components) and that the samples correspond to a zero original waveform, then it would be expected that the reconstruction output $x_n$ be equal to zero. Thus, the following may be computed.

$$x_n = (1/a_0) y_n - (b_1/a_0) y_{n-1},$$

and since $x_n = 0$ may be given, then $$b_1 = y_n / y_{n-1}.$$

The computation may virtually give an exact value of $b_1$ corresponding to the component values of R and C at the time the samples $y_{n-1}$ and $y_n$ are taken. Furthermore, it may be possible to reduce the number of division operations, thus reducing CPU time in some architectures. To achieve this, the formula herein for $b_1$ is done only once at the first time a "1" is sent to circuit 71, which generally occurs at a start or power-up of system 20. From that point on, such as square 67 and other low points of the reconstruction 79 beyond square 66, which may be regarded as $x_n$, the value $b_1$ may incrementally be maintained to account for temperature drift and/or other factors. The algorithm for incrementally maintaining $b_1$ (and thus also $a_0$) is indicated in the following. Every time a host sends a "1", the data may be sampled as indicated herein, and the system may compute $$x_n = (1/a_0) y_n - (b_1/a_0) y_{n-1},$$

using the current values of $b_1$ and $a_0$.

If $x_n > 0$, then $b_1$ is too small; so then it should be increased by a small amount. On the other hand, if $x_n < 0$, then $b_1$, is too large, so then it should be reduced by a small amount. In practice, increasing or decreasing the value "by a small amount" may be interpreted as increasing or decreasing it by 1 percent or so. It may be noted that both the direct and incremental approaches, whenever $b_1$ is changed, $a_0$ is implicitly changed since $a_0 = 1 - b_1$. A goal of the calibration approach is to ensure that the reconstruction 79 of system 20 is effectively accurate. The calibration and/or maintenance of the calibration may occur automatically in system 20.

To recap, the present approach for calibration of the reconstruction system 20 may include inputting a first signal to a low-pass filter, taking at least two samples of an output from the low-pass filter 12, inputting the output of the low-pass filter to analog to digital converter 13, and inputting an output of the analog to digital converter to processor 76. The processor may output a reconstruction of the first signal 61, which is calibrated according to an expression.

The first signal 61 may have a logic one and zero, in that order. The logic zero 68 may be during a first period of time and the at least two samples 63, 64 may be taken during the first period of time.

The expression may include $x_n = (1/a_0) y_n - (b_1/a_0) y_{n-1}$, where $y_{n-1}$ = a magnitude of one sample of the at least two samples, $y_n$ = a magnitude of another and subsequent sample of the at least two samples, $y_{n-1} \geq y_n$, and $x_n$ = a low value of a reconstruction of the first signal, during the first period of time. The low-pass filter 12 may include a resistance and a capacitance where R=ohms of the resistance and C=microfarads of the capacitance. Also, $f_s$ = frequency of the samples, $b_1 = e^{(-1/RCf_s)}$, and $a_0 = 1 - b_1$.

It may be noted that if the raw data line 61 makes no excursion away from the logic zero between the at least two samples 63, 64, then the $x_n$ should be about zero. Thus, $b_1 = y_n / y_{n-1}$, if $x_n$ is zero.

A second signal, which may be like the first signal, may be input to the low-pass filter 12 and $x_n$ may be measured. If $x_n$ is greater than zero, then $b_1$ may be increased by a small amount. If $x_n$ is less than zero, then $b_1$ may be decreased by a small amount. The term $b_1$ may be increased or decreased until $x_n$ equals approximately zero. A "small amount" means about one percent of a given amount being changed.

The expression $x_n = (1/a_0) y_n - (b_1/a_0) y_{n-1}$, may be implemented once at the first time that a logic one of the first signal is inputted to the low-pass filter 12. At subsequent times that a logic one is inputted to the low-pass filter, then $b_1$ may be incremented one way or the other to maintain $x_n$ equal to about zero. The processor 76 may output a sufficiently accurate reconstruction 79 by automatically adjusting $b_1$ to maintain $x_n$ at about 0. The first time that the logic one is input to the low pass filter may generally occur during a start or power-up of system 20 which may include the low-pass filter 12, analog-to-digital converter 13 and processor 76.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A method for calibration comprising:
   inputting a first signal to a low-pass filter;
   taking at least two samples of an output from the low-pass filter;
   inputting the output of the low-pass filter to an analog to digital converter; and
   inputting an output of the analog to digital converter to a processor; and
   wherein the processor outputs a reconstruction of the first signal, which is calibrated according to an algebraic expression that accounts for characteristics of the low-pass filter.

2. The method of claim 1, wherein:
   the first signal comprises at least a logic one and zero, in that order;
   the logic zero is during a first period of time; and
   the at least two samples are taken during the first period of time.

3. The method of claim 2, wherein:
   the algebraic expression comprises $x_n = (1/a_0) y_n - (b_1/a_0) y_{n-1}$;
   $y_{n-1}$ = a magnitude of one sample of the at least two samples;
   $y_n$ = a magnitude of another and subsequent sample of the at least two samples;
   $y_{n-1} \geq y_n$;
   $x_n$ = a low value of a reconstruction of the first signal, during the first period of time;
   the low-pass filter comprises a resistance and a capacitance;

R=ohms of the resistance;
C=microfarads of the capacitance;
$f_s$=frequency of the samples;
$b_1 = e^{(-1/RCF_s)}$; and
$a_0 = 1-b_1$.

4. The method of claim 3, wherein $x_n$ is about zero.

5. The method of claim 4, wherein $b_1 = y_n/y_{n-1}$ if $x_n$ is zero.

6. The method of claim 5, further comprising:
inputting a second signal to the low-pass filter;
measuring $x_n$;
if $x_n$ is greater than zero, then increase $b_1$ by a small amount;
if $x_n$ is less than zero, then decrease $b_1$ by a small amount;
$b_1$ is increased or decreased until $x_n$ equals approximately zero.

7. The method of claim 6, wherein a "small amount" means about one percent of a given amount being changed.

8. The method of claim 6, wherein:
the algebraic expression is implemented once at a first time that a logic one of the first signal is inputted to the low-pass filter; and
at subsequent times that a logic one is inputted to the low-pass filter, then $b_1$ is incremented to maintain $x_n$ equal to about zero.

9. The method of claim 8, wherein the first time that a logic one is input to the low pass filter occurs during a power-up of the low-pass filter, analog-to-digital converter and processor.

10. A system for calibration comprising:
a low-pass filter;
an analog-to-digital converter connected to the low-pass filter; and
a processor connected to the analog-to-digital converter; and
wherein:
an output of the processor is a reconstruction of a known input signal to the low-pass filter; and
samples of an output of the low-pass filter are used for calibrating the output of the processor.

11. The system of claim 10, wherein:
the known input signal to the low-pass filter comprises a logic one and a zero;
the zero occurs for a first period of time after the logic one; and
samples of the output of the low-pass filter are taken during the first period of time.

12. The system of claim 11, wherein the reconstruction of the known input signal to the low-pass filter is calibrated according the samples and an algebraic expression.

13. The system of claim 12,
the algebraic expression comprises $x_n = (1/a_0)y_n - (b_1/a_0)y_{n-1}$;
$y_{n-1}$=a magnitude of one sample of the samples;
$y_n$=a magnitude of another sample of the samples;
$x_b$=a low value of a reconstruction of the input signal to the filter, during the first period of time;
the low-pass filter comprises a resistance and a capacitance;
R=ohms of the resistance;
C=microfarads of the capacitance;
$f_s$=frequency of the samples; and
$b_1 = e^{(-1/RCF_s)}$;
$a_0 = 1-b_1$.

14. The system of claim 13, wherein $b_1 = y_n/y_{n-1}$ if $x_n$ is zero.

15. The system of claim 14, wherein:
if $x_n$ is greater than zero, then increase $b_1$;
if $x_n$ is less than zero, then decrease $b_1$;
$b_1$ is increased or decreased until $x_n$ equals approximately zero.

16. The system of claim 15, wherein:
the algebraic expression is implemented once at a first time that the input to the filter comprises a logic one; and
at subsequent times that the input to the filter comprises a logic one, then $b_1$ is incremented to maintain $x_n$ equal to about zero.

17. A method for calibrating comprising:
providing a filter;
connecting a converter to the low pass filter; and
connecting a processor to the converter; and
wherein:
the filter is for low-pass filtering an input signal having pulses at a first frequency, the filter severely attenuating frequencies in the range of the first frequency;
the converter is for converting an output signal of the filter into a digital signal, the converter sampling the output signal at a sampling frequency at least twice the first frequency; and
the processor is for providing a reconstruction of the input signal and for calibrating the reconstruction using the digital signal from the converter.

18. A method of claim 17, further comprising:
taking samples of an output from the filter;
assuming a low value $x_n$ of the reconstruction to be 0; and
solving the expression $x_n = (1/a_0)y_n - (b_1/a_0)y_{n-1}$ for $b_1$; and
wherein:
$y_{n-1}$ is a magnitude of a first sample of the samples;
$y_n$ is a magnitude of a second sample of the samples;
$y_{n-1} \geq y_n$; and
$a_0 = 1-b_1$.

19. The method of claim 18, further comprising:
subsequently measuring $x_n$; and
maintaining $x_n$ at about 0 by adjusting $b_1$.

20. The method of claim 19, wherein the processor outputs an accurate reconstruction by automatically adjusting $b_1$ to maintain $x_n$ at about 0.

* * * * *